United States Patent
Qin et al.

(10) Patent No.: US 12,295,239 B2
(45) Date of Patent: May 6, 2025

(54) FLEXIBLE DISPLAY PANEL, FLEXIBLE DISPLAY DEVICE

(71) Applicant: Shenzhen China Star Optoelectronics Semiconductor Display Technology Co., Ltd., Guangdong (CN)

(72) Inventors: Shijian Qin, Guangdong (CN); Wanliang Zhou, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/622,872

(22) PCT Filed: Dec. 9, 2021

(86) PCT No.: PCT/CN2021/136708
§ 371 (c)(1),
(2) Date: Dec. 27, 2021

(87) PCT Pub. No.: WO2023/097733
PCT Pub. Date: Jun. 8, 2023

(65) Prior Publication Data
US 2024/0040895 A1    Feb. 1, 2024

(30) Foreign Application Priority Data
Nov. 30, 2021   (CN) .......................... 202111450542.5

(51) Int. Cl.
*H10K 59/80*  (2023.01)
*H10K 59/12*  (2023.01)
*H10K 102/00* (2023.01)

(52) U.S. Cl.
CPC ... *H10K 59/80516* (2023.02); *H10K 59/1201* (2023.02); *H10K 59/80522* (2023.02); *H10K 2102/311* (2023.02)

(58) Field of Classification Search
CPC ......... H10K 59/80516; H10K 59/1201; H10K 59/80522; H10K 2102/311; H10K 59/122; H10K 59/123; H10K 59/131
See application file for complete search history.

(56) References Cited

U.S. PATENT DOCUMENTS

2014/0312323 A1*  10/2014  Park ................. H10K 59/80522
                                                                  438/23
2016/0079334 A1    3/2016  Lee et al.
(Continued)

FOREIGN PATENT DOCUMENTS

CN      101217153       7/2008
CN      106206645       12/2016
(Continued)

*Primary Examiner* — Julia Slutsker

(57) ABSTRACT

The invention provides a flexible display panel and a flexible display device. The flexible display panel includes: a substrate, an auxiliary cathode provided on the substrate, an separation layer disposed on the substrate and the auxiliary cathode and defining a first opening to expose the auxiliary cathode, a passivation layer disposed on the separation layer and extending into the first opening as an undercut structure, an auxiliary anode arranged in the first opening and connected to the auxiliary cathode, and a cathode layer arranged on the auxiliary anode with a left end and a right end respectively connected with the auxiliary anode.

20 Claims, 14 Drawing Sheets

(56) References Cited

U.S. PATENT DOCUMENTS

| | | | |
|---|---|---|---|
| 2016/0093680 A1 | 3/2016 | Paek et al. | |
| 2017/0125725 A1 | 5/2017 | Paek et al. | |
| 2017/0317154 A1* | 11/2017 | Heo | H10K 50/824 |
| 2020/0227672 A1 | 7/2020 | Liu | |
| 2021/0193954 A1* | 6/2021 | Shin | H10K 59/80522 |
| 2021/0202655 A1 | 7/2021 | Cho et al. | |

FOREIGN PATENT DOCUMENTS

| | | |
|---|---|---|
| CN | 107039491 | 8/2017 |
| CN | 208596710 | 3/2019 |
| CN | 109671739 | 4/2019 |
| CN | 109979964 | 7/2019 |
| CN | 110911580 | 3/2020 |
| CN | 111211243 | 5/2020 |
| CN | 113097409 | 7/2021 |
| CN | 113097412 | 7/2021 |
| CN | 113437115 | 9/2021 |

* cited by examiner

FLEXIBLE DISPLAY PANEL, FLEXIBLE DISPLAY DEVICE

RELATED APPLICATIONS

This application is a National Phase of PCT Patent Application No. PCT/CN2021/136708 having International filing date of Dec. 9, 2021, which claims the benefit of priority of Chinese Patent Application No. 202111450542.5 filed on Nov. 30, 2021. The contents of the above applications are all incorporated by reference as if fully set forth herein in their entirety.

FIELD AND BACKGROUND OF THE INVENTION

This application relates to the field of display technology, in particular to a flexible display panel and a flexible display device.

Organic Light Emitting Display (OLED) display devices, recognized by the industry as the most promising display device, have the following advantages: self-luminous, low driving voltage, high luminous efficiency, short response time, high definition and contrast, close to 180° viewing angle, wide operating temperature range, flexible display and large-area full-color display.

With the progress of the times and technology, large-size, high-resolution OLED display devices have gradually developed. Correspondingly, a large-size OLED display device also requires a larger-size panel and a larger number of pixels, and the panel wire length will become longer and longer, and the wire resistance will also be larger. Inevitably, the voltage will produce a voltage drop (IR Drop) on the wire, and the resistance value of the wire makes the voltage obtained by each pixel drive circuit different, so that under the same data signal voltage input, different pixels have different current and brightness output, causing uneven display brightness of the entire panel.

At present, the IR Drop of the cathode layer is usually improved by forming an undercut (undercut) structure in the deep hole of the PLN (flat layer) of the display panel and combining it with the auxiliary cathode.

However, the weak resistance to bending and deformation in the display panel is mainly the deep-hole deformation zone, and the PLN is an organic film layer, which is easy to absorb water and oxygen, so as to affect the performance and operation of the EL device. Therefore, the stability of the undercut structure area in the existing display panel products needs to be improved.

SUMMARY OF THE INVENTION

The embodiment of the present application provides a flexible display panel to improve a stability of an undercut structure in the flexible display panel.

In a first aspect, an embodiment of this application provides a flexible panel with a light-emitting area and a non-light-emitting area surrounding the light-emitting area, including: a substrate, an auxiliary cathode arranged on the substrate and in the non-light-emitting area, a separation layer arranged on the substrate and the auxiliary cathode and defining a first opening in the non-light-emitting area to expose an upper surface of the auxiliary cathode, a passivation layer arranged on the separation layer, extending into the first opening, and located above the auxiliary cathode to form an undercut structure, an auxiliary anode arranged in the first opening, wherein a lower end of the auxiliary anode connects to the upper surface of the auxiliary cathode, and an upper end of the auxiliary anode is located on the passivation layer, and a cathode layer arranged on the auxiliary anode, wherein a left end and a right end of the cathode layer are respectively extended downward to connect with a left side and a right side of the upper end of the auxiliary anode.

Among them, the flexible display panel further includes a source electrode and a drain electrode, which are arranged on the substrate in the light-emitting area; the separation layer further includes a second opening arranged in the light-emitting area to expose the upper surface of the source electrode and the drain electrode.

Among them, the passivation layer is also located on the separation layer to expose the second opening, the flexible display panel further includes an anode disposed in the second opening, the anode is located under the cathode layer, the lower end of the anode connects to the upper surface of the source and the drain, and the upper end of the anode is located on or above the passivation layer.

Among them, the flexible display panel further includes a light-emitting common layer and an organic light-emitting layer, the light-emitting common layer is respectively disposed on the auxiliary anode and the anode, the organic light-emitting layer is disposed between the light-emitting common layers on or above the anode.

Among them, the light-emitting common layer includes a hole injection layer, a hole transport layer, an electron transport layer, and an electron injection layer; the organic light-emitting layers are located between the hole injection layer and the hole transport layer and between the electron transport layer and the electron injection layer.

Among them, the passivation layer is an inorganic layer made of inorganic materials.

Among them, the thickness of the passivation layer is 10~100 Å, and the thickness of the passivation layer is thicker than the sum of the thickness of the electron transport layer and the electron injection layer.

Among them, the forming method of the undercut structure of the passivation layer is forming by HFC liquid wet etching or by dry etching equipment.

Among them, the inorganic materials include $SiO_2$ and $SiN_x$.

Among them, the metal material of the auxiliary anode and the anode includes Ag/Cu/AL/Mo/Ti, IZO/Ag/IZO, or ITO/Ag/ITO.

In a second aspect, an embodiment of the present application further provides a flexible display device. The flexible display device includes a display panel with a light-emitting area and a non-light-emitting area surrounding the light-emitting area, including: a substrate; an auxiliary cathode, arranged on the substrate and in the non-light-emitting area; a separation layer, arranged on the substrate and the auxiliary cathode, including a first opening in the non-light-emitting area to expose the upper surface of the auxiliary cathode; a passivation layer, arranged on the separation layer, extending into the first opening, and located above the auxiliary cathode, to form an undercut structure; an auxiliary anode, arranged in the first opening, wherein the lower end of the auxiliary anode connects to the upper surface of the auxiliary cathode, and the upper end of the auxiliary anode is located on the passivation layer; and a cathode layer, arranged on the auxiliary anode, and the left and right ends of the cathode layer respectively extend downward to connect to the left side and right side of the upper end of the auxiliary anode.

Among them, the flexible display panel further includes a source electrode and a drain electrode, which are arranged on the substrate in the light-emitting area; the separation layer further includes a second opening arranged in the light-emitting area to expose the upper surface of the source electrode and the drain electrode.

Among them, the passivation layer is also located on the separation layer to expose the second opening, the flexible display panel further includes an anode disposed in the second opening, the anode is located under the cathode layer, the lower end of the anode connects to the upper surface of the source and the drain, and the upper end of the anode is located on or above the passivation layer.

Among them, the flexible display panel further includes a light-emitting common layer and an organic light-emitting layer, the light-emitting common layer is respectively disposed on the auxiliary anode and the anode, the organic light-emitting layer is disposed between the light-emitting common layers on or above the anode.

Among them, the light-emitting common layer includes a hole injection layer, a hole transport layer, an electron transport layer, and an electron injection layer; the organic light-emitting layers are located between the hole injection layer and the hole transport layer and between the electron transport layer and the electron injection layer.

Among them, the passivation layer is an inorganic layer made of inorganic materials.

Among them, the thickness of the passivation layer is 10~100 Å, and the thickness of the passivation layer is thicker than the sum of the thickness of the electron transport layer and the electron injection layer.

Among them, the forming method of the undercut structure of the passivation layer is forming by HFC liquid wet etching or by dry etching equipment.

Among them, the inorganic materials include $SiO_2$ and $SiN_x$.

Among them, the metal material of the auxiliary anode and the anode includes Ag/Cu/AL/Mo/Ti, IZO/Ag/IZO, or ITO/Ag/ITO.

The flexible display panel of the embodiments of the present application provides a passivation layer on the separation layer of the substrate, to extend the passivation layer into the first opening in the non-light-emitting area where the surface of the auxiliary cathode is exposed, and to form an undercut structure above the auxiliary cathode, so as to improve the IR Drop of the cathode layer by the combination of the undercut structure and the auxiliary cathode, to reduce the depth of the deep hole formed by the undercut structure, to improve the bending resistance and deformation strength of the undercut structure, and to improve the stability of the undercut structure area in the flexible display panel.

BRIEF DESCRIPTION OF THE SEVERAL VIEWS OF THE DRAWINGS

In order to more clearly describe the technical solutions in the embodiments of the present application, the following will briefly introduce the drawings that need to be used in the description of the embodiments. Obviously, the drawings in the following description are only some embodiments of the present application. For those skilled in the art, other drawings could be obtained based on these drawings without creative work.

DESCRIPTION OF SPECIFIC EMBODIMENTS OF THE INVENTION

Figure 1:
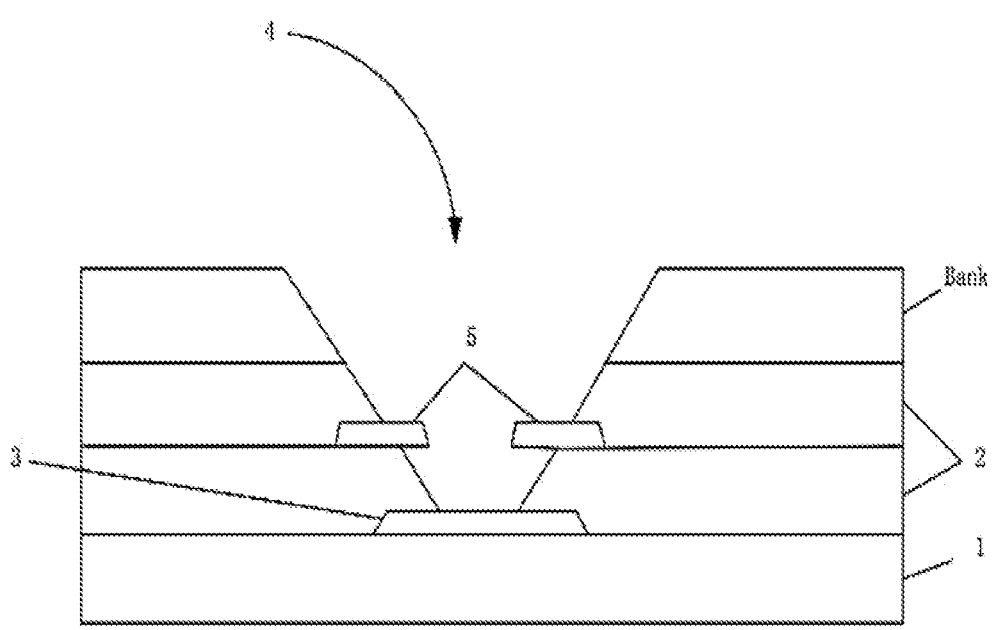
FIG. 1 is a schematic diagram of a partial structure of an existing display panel.

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application.

The following disclosure provides many different embodiments or examples for realizing different structures of the present invention. In order to simplify the disclosure of the present invention, the components and settings of specific examples are described below. Of course, they are only examples, and are not intended to limit the invention. In addition, the present invention may repeat reference numbers and/or reference letters in different examples, and this repetition is for the purpose of simplification and clarity and does not in itself indicate the relationship between the various embodiments and/or settings discussed. In addition, the present invention provides examples of various specific processes and materials, but those of ordinary skill in the art may be aware of the application of other processes and/or the use of other materials.

In the description of this application, it should be understood that the terms of vertical, horizontal, length, width, upper, lower, front, rear, left, right, vertical, and horizontal, just illustrate the orientation or positional relationship are based on the orientation or positional relationship shown in the drawings and is only for the convenience of describing the application and simplifying the description, rather than indicating or implying that the device or element referred to must have a specific orientation, be constructed and operated in a specific orientation, so that cannot be understood as a restriction on this application. In addition, the terms "first" and "second" are only used for descriptive purposes and cannot be understood as indicating or implying relative importance or implicitly indicating the number of indicated technical features. So the features defined with "first" and "second" may explicitly or implicitly include one or more of the features. In the description of the present application, "a plurality of" means two or more than two, unless otherwise specifically defined. In this application, "/" means "or".

At present, since the cathode layer of the existing OLED display panel has a serious voltage drop, so a combination of an auxiliary cathode and an undercut structure is often used to reduce the voltage drop of the cathode layer. Please refer to FIG. 1, which is a schematic diagram of a partial structure of an existing display panel. As shown in FIG. 1, the display panel includes a substrate 1, an auxiliary cathode 3 disposed on the substrate 1, and a separation layer 2 disposed on the substrate 1 and the auxiliary cathode 3. Wherein, the separation layer 2 forms an opening 4 above the corresponding auxiliary cathode 3 to expose the auxiliary cathode 3, a blocking portion 5 is provided on the separation layer 2, and the blocking portion 5 extends into the opening 4 and is located above the auxiliary cathode 3; hence, a space (an undercut structure) is formed between the blocking portion 5 and the auxiliary cathode 3, and the cathode layer (not shown in the FIG.) can extend into the space and be in contact with the auxiliary cathode 3. However, due to the depth of the space formed by the undercut structure, the bending resistance and deformation resistance of the flexible display panel is deteriorated, and the stability of the undercut structure area in the flexible display panel is reduced.

Figure 2:
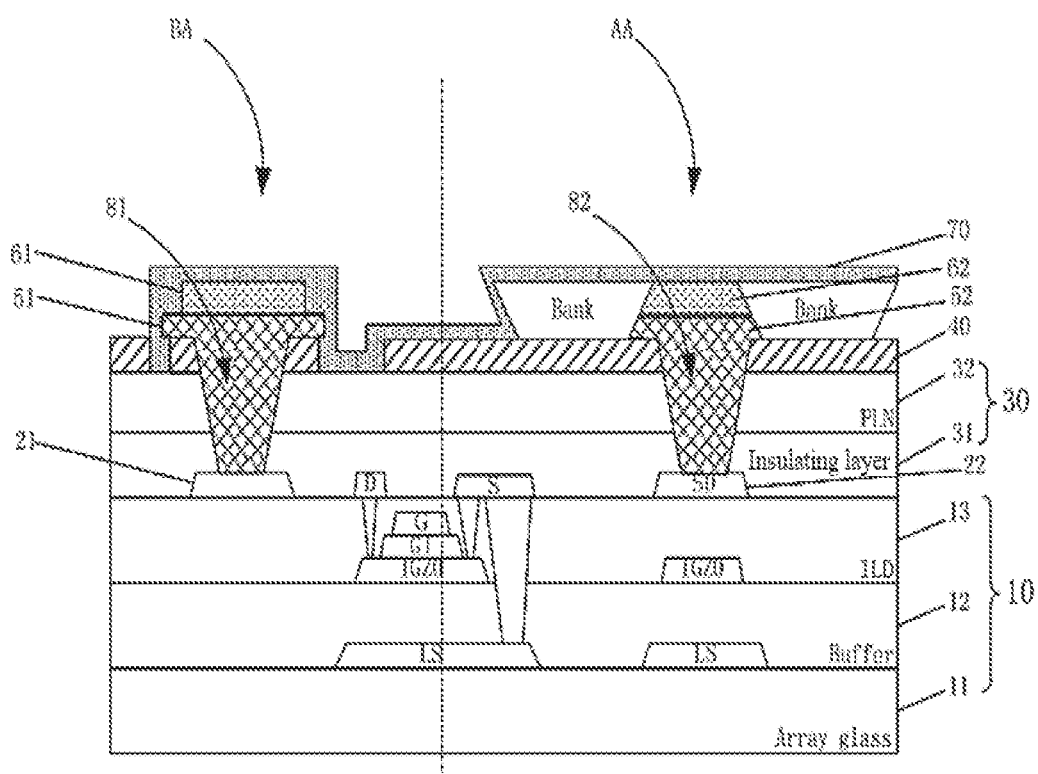
FIG. 2 is a schematic structural diagram of a flexible display panel provided by an embodiment of the present application.

In order to solve the above technical problems, embodiments of the present invention provide a flexible display panel; please refer to FIG. 2, which is a schematic structural diagram of a flexible display panel provided by an embodiment of the present application. The flexible display panel includes a light-emitting area AA and a non-light-emitting area BA surrounding the light-emitting area, a substrate 10, an auxiliary cathode 21, a separation layer 30, a passivation layer 40, an auxiliary anode 51, and a cathode layer 70.

Wherein, the auxiliary cathode 21 is disposed on the substrate 10 and located in the non-light-emitting area BA.

The separation layer 30 is disposed on the substrate 10 and the auxiliary cathode 21 and includes a first opening 81 disposed in the non-light emitting area BA to expose the upper surface of the auxiliary cathode 21.

The passivation layer 40 is disposed on the separation layer 30 and extends into the first opening 81 above the auxiliary cathode 21 to form an undercut structure.

In this embodiment, the combining undercut structure with the auxiliary cathode 21 could improve IR Drop of the cathode layer.

The auxiliary anode 51 is arranged in the first opening 81, the lower end of the auxiliary anode 51 is connected to the upper surface of the auxiliary cathode 21, and the upper end of the auxiliary anode 51 is arranged on the passivation layer 40.

The cathode layer 70 is arranged on the auxiliary anode 51, and the left and right ends of the cathode layer 70 respectively extend downward to connect to the left and right sides of the upper end of the auxiliary anode 51.

In the embodiment of the present invention, it can be known by comparing FIG. 1 and FIG. 2 that the undercut structure in the display panel of the prior art is located in the separation layer, so that the deep hole formed by the undercut structure has a deeper opening depth; however, compared with the prior art, the undercut structure in the flexible display panel provided by the embodiment of the present invention is located above the separation layer, so as to effectively reduce the depth of the deep hole formed by the undercut structure.

In the embodiment of the present invention, a passivation layer 40 is provided on the separation layer 30 of the substrate 10, and the passivation layer 40 is extended into the first opening 81, where the surface of the auxiliary cathode 21 is exposed, in the non-light-emitting area BA above the auxiliary cathode 21 to form an undercut structure, so as to improve the IR Drop of the cathode layer by combining the undercut structure with the auxiliary cathode 21, reduce the depth of the deep hole formed by the undercut structure, improve the bending resistance and deformation strength of the undercut structure, and improve the stability of the undercut structure area in the flexible display panel.

In this embodiment, please continue to refer to FIG. 2. The flexible display panel provided by the embodiment of the present invention further includes a source electrode and a drain electrode 22 disposed on the substrate and in the light-emitting area AA.

The separation layer 30 further includes a second opening 82 disposed in the light-emitting area AA to expose the upper surfaces of the source and drain electrodes 22.

Wherein, the passivation layer 40 is also located on the separation layer 30 to expose the second opening 82, the flexible display panel further includes an anode 52 disposed in the second opening 82, the anode 52 is located under the cathode layer 70, the lower end of the anode 52 is connected to the upper surface of the source and drain 22, and the upper end of the anode 52 is located on the passivation layer 40.

In this embodiment, the materials used for the auxiliary anode 51 and the anode 52 include mixed metals such as Ag/Cu/AL/Mo/Ti, IZO/Ag/IZO, ITO/Ag/ITO, etc. The etching selection ratio of the passivation layer 40 to the metal material of the auxiliary anode 51 or the anode 52 is greater than 20 or more.

It should be noted that the selection ratio is the ratio of the etching rate between different substances. Wherein, it can be divided into the selection ratio of the mask material and the selection ratio of the underlying material to be etched. The higher the selection ratio, the better; a high selection ratio means that only the part of the material that you want to be carved is removed. The selection ratio can be expressed as: the selection ratio=rate of material to be etched/rate of material not to be etched.

In some embodiments, the flexible display panel further includes a light-emitting common layer 60 and an organic light-emitting layer (not shown in the FIG.). The light-emitting common layer 60 is respectively disposed on the auxiliary anode 51 and the anode 52, and a first light-emitting common layer 61 is on the auxiliary anode 51, and a second light-emitting common layer 62 is on the anode 52.

The organic light-emitting layer (not shown in the FIG.) is disposed on the anode 52. The organic light-emitting layer (not shown in the FIG.) is located between the light-emitting common layers on the anode 52, and the organic light-emitting layer (not shown in the FIG.) is also located between the second light-emitting common layer 62.

The light-emitting common layer 60 includes a hole injection layer (not shown in the FIG.), a hole transport layer (not shown in the FIG.), an electron transport layer (not shown in the FIG.), and an electron injection layer (not shown in the FIG.). The organic light-emitting layer (not shown in the FIG.) is located between the hole injection layer (not shown in the FIG.) and the hole transport layer (not shown in the FIG.), and the organic light-emitting layer is also located between the electron transport layer (not shown in the FIG.) and the electron injection layer (not shown in the FIG.).

In this embodiment, by injecting a voltage into the holes of the anode 52 to combine with the electrons from the cathode layer 70 in the organic light-emitting layer, the organic material can be excited to emit light, so the flexible display panel can emit light.

Specifically, the method of using the organic material in the organic light-emitting layer to emit light independently is as follows: preparing the red, green and blue luminous centers, and then adjusting the color mixing ratio of the three color combinations to produce true colors, so that the three-color OLED elements independently emit light to form a pixel to realize the full-color technology of the display panel.

In other embodiments, since the undercut structure in the existing display panel is arranged in the middle of the PLN (flat layer), the PLN (flat layer) is an organic film layer which is easily absorbing water and oxygen, so as to affect the performance and operation of the EL device.

In order to solve the above technical problems at the same time, the passivation layer 40 provided in this embodiment is an inorganic layer made of inorganic materials. Wherein, the inorganic materials include SiO2 and SiNx, etc. Therefore, by using the passivation layer 40 made of an inorganic material as an undercut structure, it is possible to effectively prevent water and oxygen generated by outgas in the organic layer from affecting the performance and operation of the EL device.

Specifically, the film thickness of the passivation layer 40 is 10-100 Å. The film thickness of the passivation layer 40 is thicker than the sum of the thickness of the electron transport layer and the electron injection layer.

It should be noted that the method for forming the undercut structure of the passivation layer 40 includes the wet etching with HFC solution and the dry etching. Wherein, the depth of the deep hole formed by the undercut structure is 1-5 μm.

To sum up, the above flexible panel with a light-emitting area and a non-light-emitting area surrounding the light-emitting area, including: a substrate; an auxiliary cathode, arranged on the substrate and in the non-light-emitting area; a separation layer, arranged on the substrate and the auxiliary cathode, including a first opening in the non-light-emitting area to expose the upper surface of the auxiliary cathode; a passivation layer, arranged on the separation layer, extending into the first opening, and located above the auxiliary cathode, to form an undercut structure; an auxiliary anode, arranged in the first opening, wherein the lower end of the auxiliary anode connects to the upper surface of the auxiliary cathode, and the upper end of the auxiliary anode is located on the passivation layer; and a cathode layer, arranged on the auxiliary anode, and the left and right ends of the cathode layer respectively extend downward to connect to the left side and right side of the upper end of the auxiliary anode. The flexible display panel, provided by the embodiments of the present application, is configured to arrange a passivation layer on the separation layer of the substrate, to extend the passivation layer into the first opening in the non-light-emitting area where the surface of the auxiliary cathode is exposed, and to form an undercut structure above the auxiliary cathode, so as to improve the IR Drop of the cathode layer by the combination of the undercut structure and the auxiliary cathode, to reduce the depth of the deep hole formed by the undercut structure, to improve the bending resistance and deformation strength of the undercut structure, and to improve the stability of the undercut structure area in the flexible display panel.

As a preferred embodiment, the embodiment of the present invention also provides a method for manufacturing the above-mentioned flexible display panel. Please refer to FIG. 3 to FIG. 14, which are schematic diagrams of the manufacturing process structure of the flexible display panel provided by the embodiment of the present invention. According to FIG. 3 to FIG. 14, the manufacturing method of the flexible display panel provided by the embodiment of the present invention includes step 101 to step 112; the specific production method process is as follows.

Figure 3:
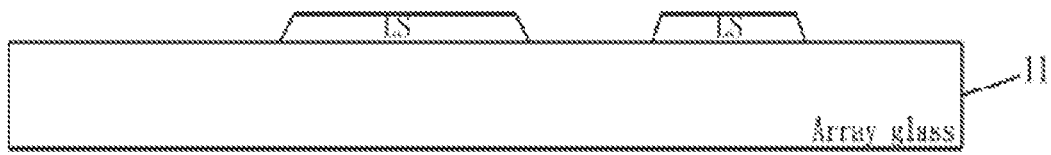
FIGS. 3, 4, 5, 6, 7, 8, 9, 10, 11, 12, 13 and 14 are schematic diagrams of the manufacturing process structure of a flexible display panel provided by an embodiment of the present invention.

Please refer to FIG. 3, the step 101 is to deposit a metal layer of Mo/Cu on the glass substrate 11 by the physical vapor or sputter method to form a light-shielding layer (LS layer), and to deposit a diffusion barrier layer and an etching barrier layer on the metal layer Mo/Cu by the physical vapor or sputter method, so as to form the LS pattern by a photolithography process. Wherein, the diffusion barrier layer adopts materials that have a work function similar to Cu, such as MoTi, Mo, Ta, etc., and the materials used in the etch stop layer include ITO, IGZO and other metal oxides.

It should be noted that the LS layer and diffusion barrier layer can use $H_2O_2$ series chemical liquid as etchant, and an oxalic acid-based chemical liquid can be used as an etching agent for the etching barrier layer.

Wherein, the physical sputtering method uses glow discharge to dissociate gases, such as Ar, into positively charged ions, to accelerate and to splash the ions on the surface of the etched object by the self-bias, and to knock out the atoms of the etched substance; this process completely utilizes the transfer of physical energy, so it is called physical etching. The self-bias voltage generated by the lower electrode will attract the positive ions in the plasma to bombard the surface of the substrate to achieve the purpose of etching the surface of the film; the advantage of this kind of etching lies in its strong etching directionality, so that a high anisotropic etching profile can be obtained to achieve a good line width control purpose.

Figure 4:
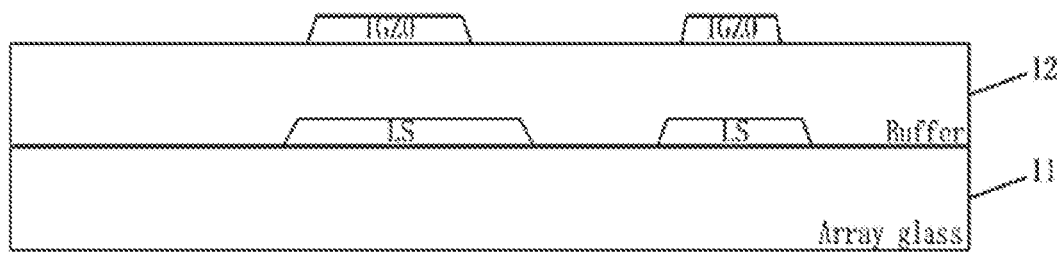

Referring to FIG. 4, the step 102 is to deposit the buffer layer 12 by a chemical vapor method, to deposit active, ITO/IGZO and other metal oxides by a physical vapor method, and to form an IGZO pattern by a photolithography process.

Specifically, in the process of step 102, an oxalic acid-based chemical liquid is used as an etchant.

Wherein the chemical gas phase method is pure chemical reactive etching, which mainly uses various energy sources (RF, DC, microwave, etc.) to give gas energy to generate plasma and extremely chemically active atom or molecule groups; then the active atom or molecule groups diffuse to the surface of the substance to be etched to react with the substance to be etched to produce a volatile reaction product, and finally the volatile product is drawn out of the reaction chamber by a vacuum device.

That is called chemical reactive etching because this reaction is completely achieved by chemical reaction. This etching method is similar to wet etching, except that the state of the reactants and products is changed from liquid to gas, and plasma is used to promote the etching rate.

Figure 5:
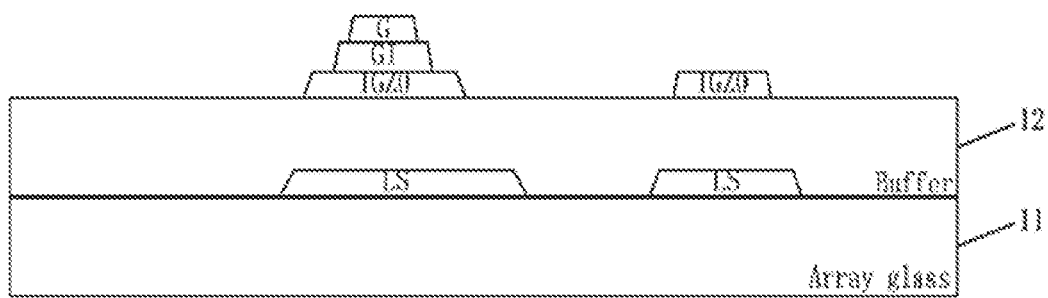

Referring to FIG. 5, the step 103 is to deposit a gate insulating layer (GI layer) by a chemical vapor method and to form a gate (G layer) and a pattern of the gate insulating layer through a photolithography process; after the gate photoresist is stripped, plasma etching is used to conduct IGZO conductive treatment.

Wherein, plasma etching, referred to as PE Plasma Etching (PE), uses high-frequency glow discharge reaction to activate the reactive gas into active particles, such as atoms or radicals; these active particles diffuse to the etched-site and react with the etched-material to form volatile reactants and be removed.

Figure 6:
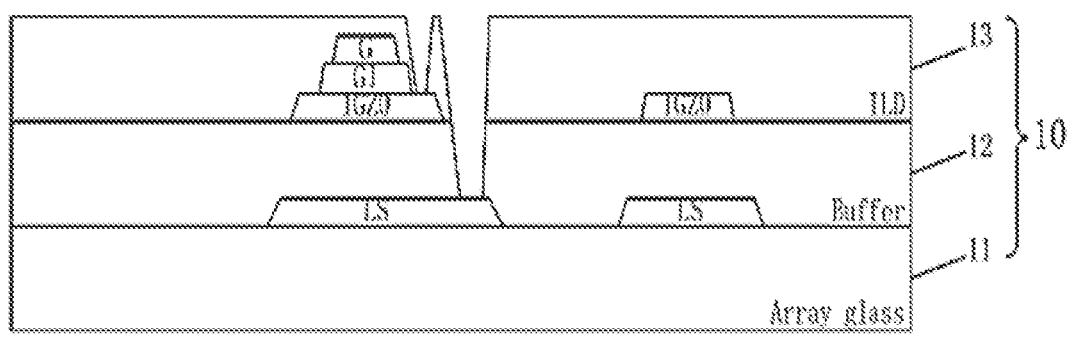

Referring to FIG. 6, the step 104 is to deposit the interphase dielectric layer, i.e., the ILD layer 13, by chemical vapor method, and dig holes on the ILD layer 13 and the Buffer layer 12 respectively through two photolithography processes.

Wherein, the step 104 is to perform dry etching treatment with an oxidizing gas such as F family; when the dry etching barrier layer is IGZO, it is also necessary to use dry etching plasma to conduct the conductive treatment of the etching barrier layer to ensure the subsequent transfer of charges between the source and drain (S/D poles) and the LS layer, so that Vth can be compensated.

Figure 7:
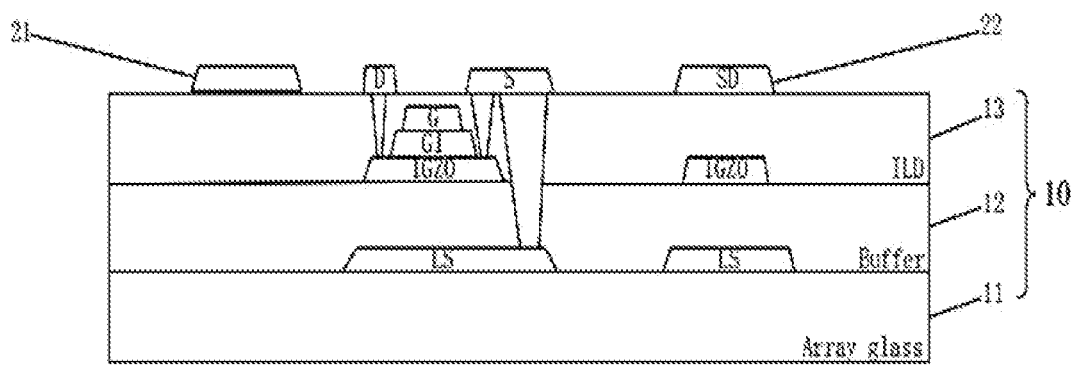

Please refer to FIG. 7, the step 105 is to form a plurality of source and drain (S/D), such as source and drain 22, by physical vapor depositing of MoTi/Cu and other metal layers through photolithography process.

Wherein, step 105 is to use $H_2O_2$ chemical liquid as an etchant to perform etching to fabricate source and drain electrodes.

Figure 8:
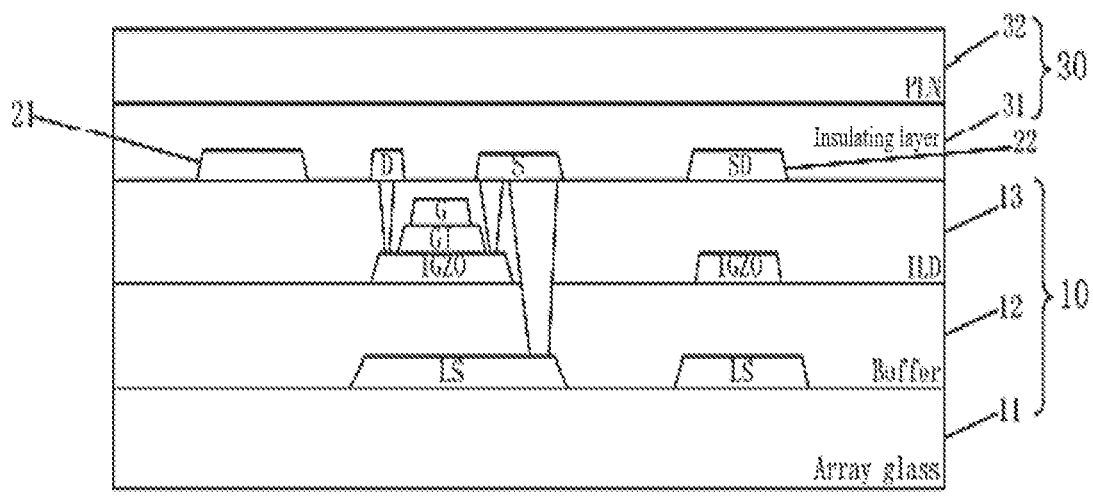

Referring to FIG. 8, the step 106 is to form the insulating layer 31 by a CVD film forming process and to form an organic flat layer, that is, the PLN layer 32 by a photo process.

Specifically, the CVD film forming process is to mix volatile metal halides and metal organic compounds with remote carrier gases such as H2, Ar or N2, and then uniformly send them to the high temperature substrate in the reaction chamber and then to perform the pyrolysis reduction, oxidation, hydrolysis, disproportionation, polymerization and other chemical reactions.

Figure 9:
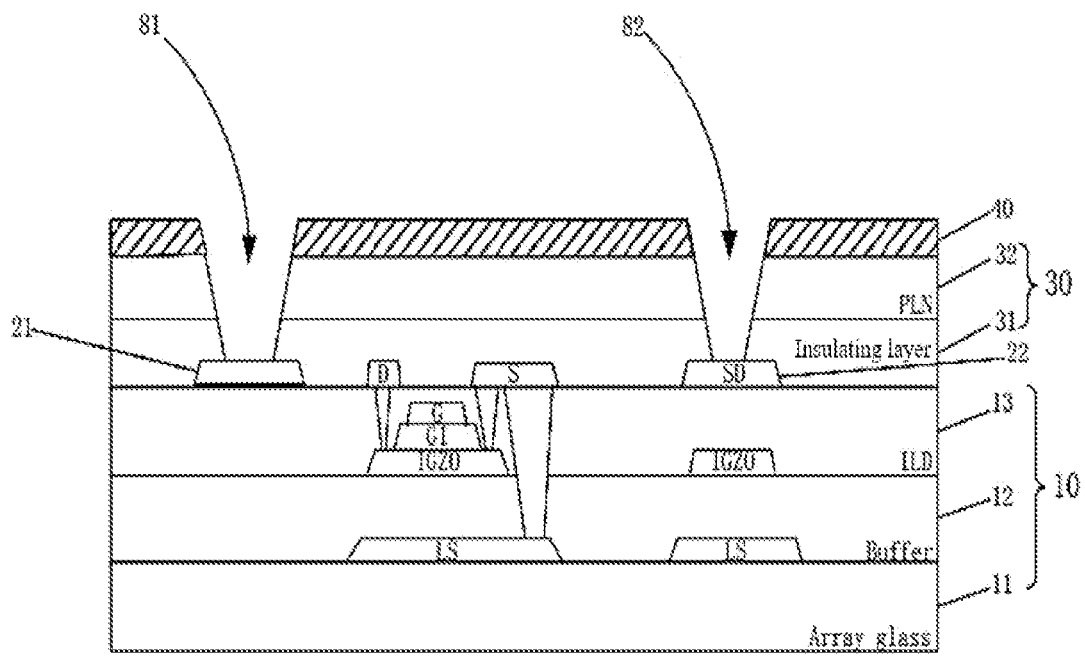

Please refer to FIG. 9, the step 107 is to deposit the passivation layer 40 by a chemical vapor method.

Wherein, the material used for the passivation layer 40 may be an inorganic non-metal film layer material of SiNx, SiOx, SiNx & SiOx interlayer. Specifically, the passivation layer 40 forms the pattern of the passivation layer 40 by a photolithography process and to complete the hole etching of the insulating layer 31, the PLN layer 32 and the passivation layer 40 by an oxidizing gas, such as F family gas, as the dry etchant, forming a first opening 81 and a second opening 82.

Figure 10:
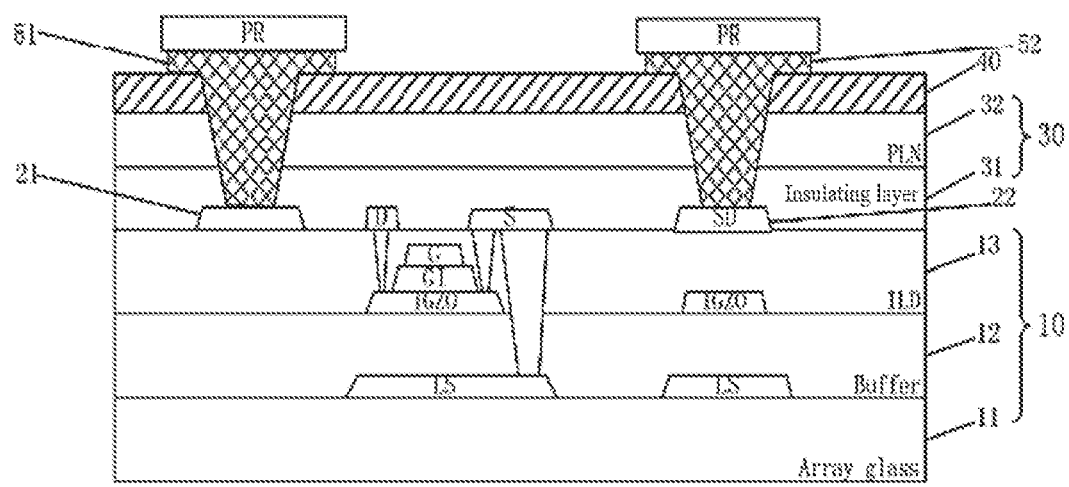

Please refer to FIG. 10, the step 108, after step 107, is to make the pixel anode ITO/Ag/ITO, so as to obtain the auxiliary anode 51 and the anode 52.

Wherein the etching process of step 108 mainly uses oxalic acid and silver acid for etching.

Figure 11:
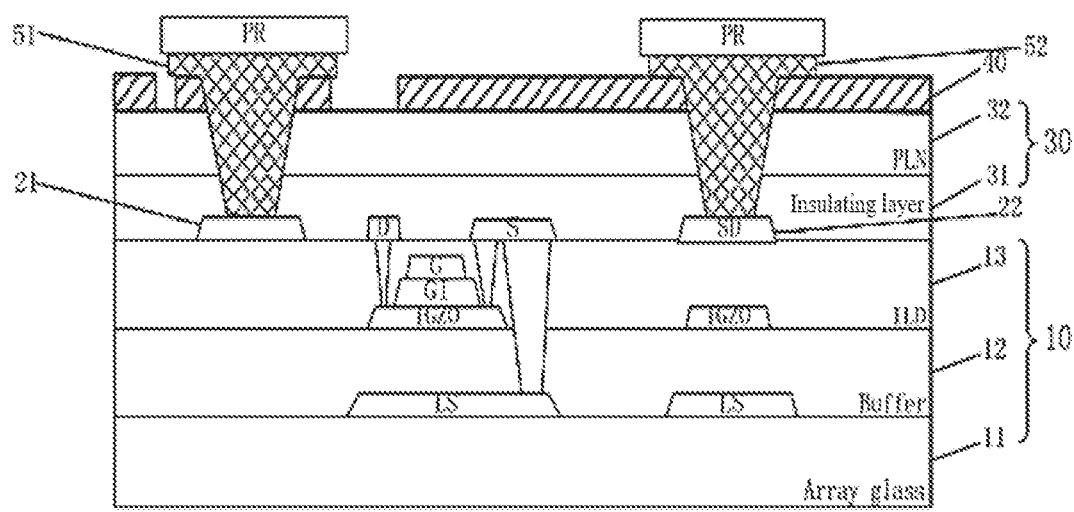

Please refer to FIG. 11, the step 109 is to perform an HFC wet etching process on the passivation layer 40 to form an undercut structure.

In this embodiment, the HFC wet etching process is performed by retaining the photoresist PR to form an undercut structure, so as to reduce one mask and to save production costs.

Figure 12:
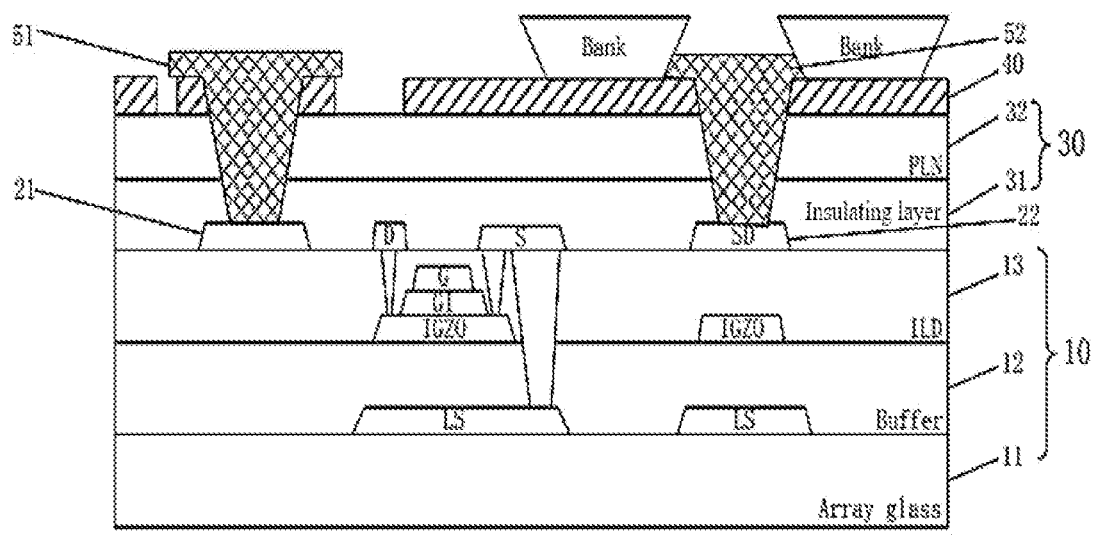

Please refer to FIG. 12, the step 110 is to complete the Bank process through the photo process.

Figure 13:
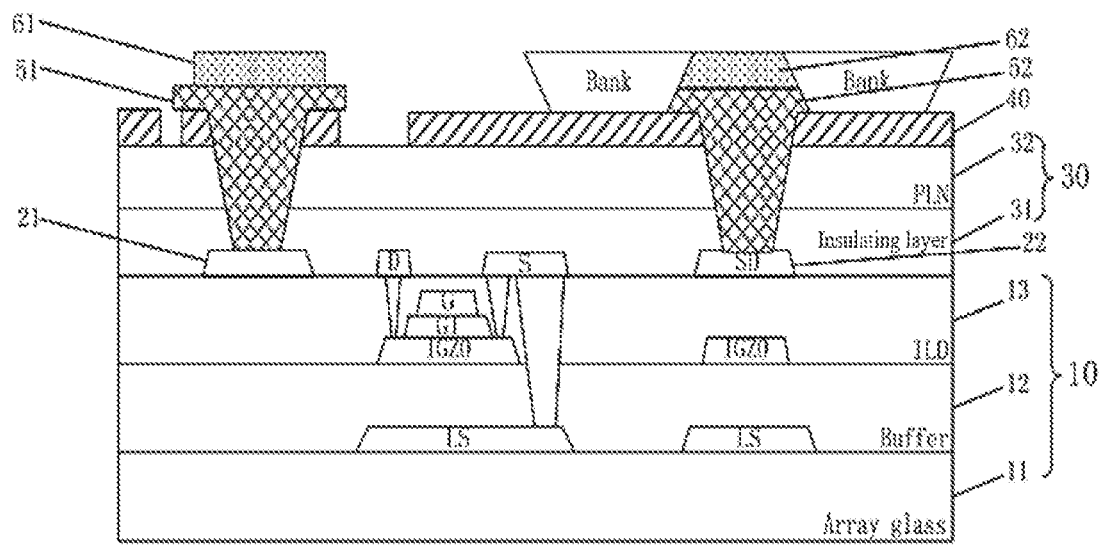

Please refer to FIG. 13, the step 111 is to print hole injection layer (HIL), hole transport layer (HTL), R/G/B organic light emitting material layer (EML), and evaporate the electron transport layer (ETL), the electron injection layer (EIL) and cathode, by inkjet printing (IJP) technology, so as to complete the production of the light-emitting common layers 61 and 62.

Figure 14:
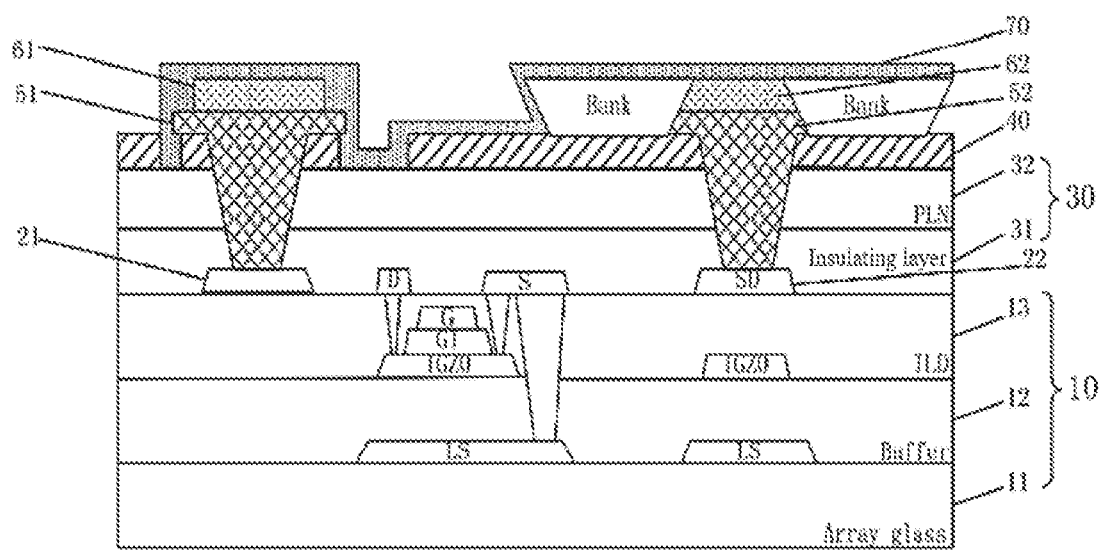

Please refer to FIG. 14, the step 112 is to perform cathode sputtering by physical sputtering, so that the left and right sides of the auxiliary anode 51 and the undercut area are in contact with the cathode layer 70, achieving the purpose of communication between the cathode layer 70 and the auxiliary cathode 21.

In summary, the flexible display panel provided by the above-mentioned embodiment can be obtained by the method for manufacturing the flexible display panel provided by this embodiment, so as to realize the beneficial effects of the flexible display panel of the above-mentioned embodiment. For specific content, please refer to the above-mentioned embodiment, which will not be repeated here.

An embodiment of the present application also provides a flexible display device, which includes the flexible display panel in any of the foregoing embodiments. For details, please refer to the above description, which will not be repeated here.

It should be noted that those skilled in the art can clearly understand that the specific implementation process and beneficial effects achieved by the above-mentioned device and each unit can refer to the corresponding description in the foregoing method embodiment. For the convenience and brevity of the description, I will not repeat them here.

What is claimed is:

1. A flexible panel with a light-emitting area and a non-light-emitting area surrounding the light-emitting area, comprising:
    a substrate;
    an auxiliary cathode arranged on the substrate and in the non-light-emitting area;
    a separation layer arranged on the substrate and the auxiliary cathode and defining a first opening in the non-light-emitting area to expose an upper surface of the auxiliary cathode;
    a passivation layer arranged on the separation layer, extending to a periphery edge of the first opening, and located above the auxiliary cathode;
    an auxiliary anode arranged in the first opening, wherein a lower end of the auxiliary anode is connected to the upper surface of the auxiliary cathode, and an upper end of the auxiliary anode is located on the passivation layer;
    an undercut structure formed in the passivation layer, comprising a hole area having a sidewall that is recessed inwardly relative to a left side or a right side of the upper end of the auxiliary anode; and
    a cathode layer arranged on the auxiliary anode, wherein a left end and a right end of the cathode layer are respectively extended downward to connect with the left side and the right side of the upper end of the auxiliary anode.

2. The flexible display panel according to claim 1, wherein the flexible display panel further comprises a source electrode and a drain electrode arranged in the light-emitting area on the substrate, and the separation layer further defines a second opening arranged in the light-emitting area to expose upper surface of the source electrode or the drain electrode.

3. The flexible display panel according to claim 2, wherein the passivation layer is further disposed on the separation layer to expose the second opening, the flexible display panel further comprises an anode disposed in the second opening, the anode is located under the cathode layer, a lower end of the anode is connected to the upper surfaces of the source and the drain, and an upper end of the anode is located on the passivation layer.

4. The flexible display panel according to claim 3, wherein the flexible display panel further comprises a light-emitting common layer and an organic light-emitting layer, the light-emitting common layer is respectively disposed on the auxiliary anode and the anode, and the organic light-emitting layer is disposed in the light-emitting common layers on the anode.

5. The flexible display panel according to claim 4, wherein the light-emitting common layer comprises a hole injection layer, a hole transport layer, an electron transport layer, and an electron injection layer, and the organic light-emitting layer is located between layers of the hole injection layer and the hole transport layer and layers of the electron transport layer and the electron injection layer.

6. The flexible display panel according to claim 5, wherein the passivation layer is an inorganic layer made of inorganic material.

7. The flexible display panel according to claim 6, wherein a thickness of the passivation layer ranges from 10 Å to 100 Å, and the thickness of the passivation layer is greater than a sum of thicknesses of the electron transport layer and the electron injection layer.

8. The flexible display panel according to claim 6, wherein a method of forming the undercut structure from the passivation layer comprises forming by HFC liquid wet etching or by dry etching equipment.

9. The flexible display panel according to claim 6, wherein the inorganic material comprises $SiO_2$.

10. The flexible display panel according to claim 3, wherein the auxiliary anode and the anode are made of metal material comprises Ag/Cu/AL/Mo/Ti, IZO/Ag/IZO, or ITO/Ag/ITO.

11. A flexible display device, comprising a display panel with a light-emitting area and a non-light-emitting area surrounding the light-emitting area, wherein the display panel comprising:
a substrate;
an auxiliary cathode arranged on the substrate and in the non-light-emitting area;
a separation layer arranged on the substrate and the auxiliary cathode and defining a first opening in the non-light-emitting area to expose an upper surface of the auxiliary cathode;
a passivation layer arranged on the separation layer, extending to a periphery edge of the first opening, and located above the auxiliary cathode;
an auxiliary anode arranged in the first opening, wherein a lower end of the auxiliary anode is connected to the upper surface of the auxiliary cathode, and an upper end of the auxiliary anode is located on the passivation layer;
an undercut structure formed in the passivation layer, comprising a hole area having a sidewall that is recessed inwardly relative to a left side or a right side of the upper end of the auxiliary anode; and
a cathode layer arranged on the auxiliary anode, wherein a left end and a right end of the cathode layer are respectively extended downward to connect with the left side and the right side of the upper end of the auxiliary anode.

12. The flexible display device according to claim 11, wherein the flexible display panel further comprises a source electrode and a drain electrode arranged in the light-emitting area on the substrate, and the separation layer further defines a second opening arranged in the light-emitting area to expose upper surface of the source electrode or the drain electrode.

13. The flexible display device according to claim 12, wherein the passivation layer is further disposed on the separation layer to expose the second opening, the flexible display panel further comprises an anode disposed in the second opening, the anode is located under the cathode layer, a lower end of the anode is connected to the upper surfaces of the source and the drain, and an upper end of the anode is located on the passivation layer.

14. The flexible display device according to claim 13, wherein the flexible display panel further comprises a light-emitting common layer and an organic light-emitting layer, the light-emitting common layer is respectively disposed on the auxiliary anode and the anode, and the organic light-emitting layer is disposed in the light-emitting common layers on the anode.

15. The flexible display device according to claim 14, wherein the light-emitting common layer comprises a hole injection layer, a hole transport layer, an electron transport layer, and an electron injection layer, and the organic light-emitting layer is located between layers of the hole injection layer and the hole transport layer and layers of the electron transport layer and the electron injection layer.

16. The flexible display device according to claim 15, wherein the passivation layer is an inorganic layer made of inorganic material.

17. The flexible display device according to claim 16, wherein the thickness of the passivation layer ranges from 10 Å to 100 Å, and the thickness of the passivation layer is greater than a sum of thicknesses of the electron transport layer and the electron injection layer.

18. The flexible display device according to claim 16, wherein a method of forming the undercut structure from the passivation layer comprises forming by HFC liquid wet etching or by dry etching equipment.

19. The flexible display device according to claim 16, wherein the inorganic material comprises $SiO_2$.

20. The flexible display device according to claim 13, wherein the auxiliary anode and the anode are made of metal material comprises Ag/Cu/AL/Mo/Ti, IZO/Ag/IZO, or ITO/Ag/ITO.

* * * * *